United States Patent
He et al.

(10) Patent No.: US 7,114,978 B2
(45) Date of Patent: Oct. 3, 2006

(54) SOCKET CONNECTOR HAVING STRUCTURE FOR PREVENTING DISTORTION

(75) Inventors: Wen He, Kunsan (CN); Fujin Peng, Kunsan (CN); Wei Yu, Kunsan (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 11/064,279

(22) Filed: Feb. 22, 2005

(65) Prior Publication Data

US 2005/0186827 A1  Aug. 25, 2005

(30) Foreign Application Priority Data

Feb. 20, 2004  (TW) .............................. 93104241 A

(51) Int. Cl.
*H01R 4/50* (2006.01)
(52) U.S. Cl. ...................................... 439/342; 439/259
(58) Field of Classification Search ................ 439/259, 439/342 I
See application file for complete search history.

(56) References Cited

U.S. PATENT DOCUMENTS

| | | | |
|---|---|---|---|
| 6,254,415 B1 | 7/2001 | Mizumura et al. | |
| 6,338,640 B1 | 1/2002 | Lin | |
| 6,431,900 B1 | 8/2002 | Yu | |
| 6,500,019 B1 * | 12/2002 | Tan | 439/342 |
| 6,579,112 B1 | 6/2003 | Nobuyuki et al. | |
| 6,669,500 B1 * | 12/2003 | Ju | 439/342 |
| 6,712,634 B1 * | 3/2004 | McClinton | 439/342 |
| 6,910,908 B1 * | 6/2005 | Tran et al. | 439/342 |
| 6,921,276 B1 * | 7/2005 | McClinton | 439/342 |

* cited by examiner

Primary Examiner—Thanh-Tam Le
(74) Attorney, Agent, or Firm—Wei Te Chung

(57) ABSTRACT

A socket connector (1) includes a base (2), a cover (3) slidably assembled onto the base and capable being moved with respect to the base along a front-to-rear direction, an actuator (5) for actuating the cover to slide on the base between a contact insert position and an engagement position, lock portion (406) and receiving arrangement (204) arranged between the base and the cover and opposite to the actuator in the front-to-rear direction so as to fasten the base and the cover tightly.

7 Claims, 4 Drawing Sheets

SOCKET CONNECTOR HAVING STRUCTURE FOR PREVENTING DISTORTION

BACKGROUND OF THE INVENTION

1. Field of the Invention

The present invention relates to an electrical connector, and more particularly to a ZIF (Zero Insertion Force) socket connector for connecting a central processing unit (CPU) of a computer system to a printed circuit board (PCB).

2. Description of Related Art

With the development of technology, socket connectors, which have pins or solder balls, are found widespread applications in computers and other electrical devices for transmitting signals and conducting current between a printed circuit board (PCB) and an IC package.

Referring to FIGS. 1–2, a conventional socket connector 9 comprises a base 91, a cover 93 slidably mounted on the base 91 and a lever 94 sandwiched between the base 91 and the cover 93. The lever 94 includes a cam shaft 944 received in the base 91 and an operating handle 940 vertically extending from the cam shaft 944. The base 91 defines a mating portion 910 with a plurality of passageways 914 vertically extending through a top and a bottom faces for receiving a plurality of terminals 92 therein, and a header portion 912 having a channel 911 extending along a lateral direction. A pair of protrusions 916 is formed on opposite side of the mating portion 910. The cover 93 includes a mating portion 930 for mating with an IC package (not shown). The mating portion 930 defines a plurality of passageways 934 in alignment with the passageways 914 for allowing downwardly extending pins of an IC package (not show) to extend therthrough to engage with the terminals 92. A pair of side walls downwardly extending from opposite ends of the mating portion 930 with a pair of slot 936 formed thereon. The cover 93 further includes a header portion 932 having a channel 931 extending along a lateral direction. A pair of locking barbs 938 are extending downwardly from the header portion 932 adjacent to the channel 931 alignment with corresponding portion of the base 91.

In assembly, the cover 93 movably mounted on the base 91, the terminals 92 is received in the passageways 914 of the base 91 and the lever 94 is sandwiched between the base 91 and the cover 93. The cover 93 can slide on the base 91 by actuating the lever 94 from a vertical position to a horizontal position, which makes pins of the IC package move simultaneously for establishing/disestablishing an electrical connection between the pins of the IC package and mating portions of the terminals 92. It is noted the steady electrical connection between the IC package and the PCB is deeply affected by the plainness between the cover and the base.

As the base 91 and the cover 93 is conventionally made from insulative materials by molded, and they should be made thin enough, they are apt to warp in molding or cooling process. When the warped base or cover are assembled, the header portions of the socket are fastened tightly enough by the engagement of the barbs 938 with the base, and the mating portions also can be engaged tightly by the engagement of the protrusions 916 with the slots 936. But the warp of the socket will make a rear portion of the socket to form an aperture, and make the contacts 92 in the rear portion touch dust out of the socket. Furthermore the warp of the socket make the passageways 934 can not alignment with the passageways 914 respectively, and the terminal 92 cannot contact the pins of the IC package steadily.

To overcome above-motioned problems, an improved socket connector is desired.

SUMMARY OF THE INVENTION

An object of the present invention, therefore, is to provide a socket connector with lock portion for preventing a plane thereof from warping.

Accordingly, to achieve the above object, a socket connector includes a base, a cover slidably assembled onto the base and capable being moved with respect to the base along a front-to-rear direction, an actuator for actuating the cover to slide on the base between a contact insert position and an engagement position, lock portion and receiving arrangement arranged between the base and the cover and opposite to the actuator in the front-to-rear direction so as to fasten the base and the cover tightly Other objects, advantages and novel features of the present invention will become more apparent from the following detailed description of the present embodiment when taken in conjunction with the accompanying drawings.

DETAILED DESCRIPTION OF THE INVENTION

Figure 1:
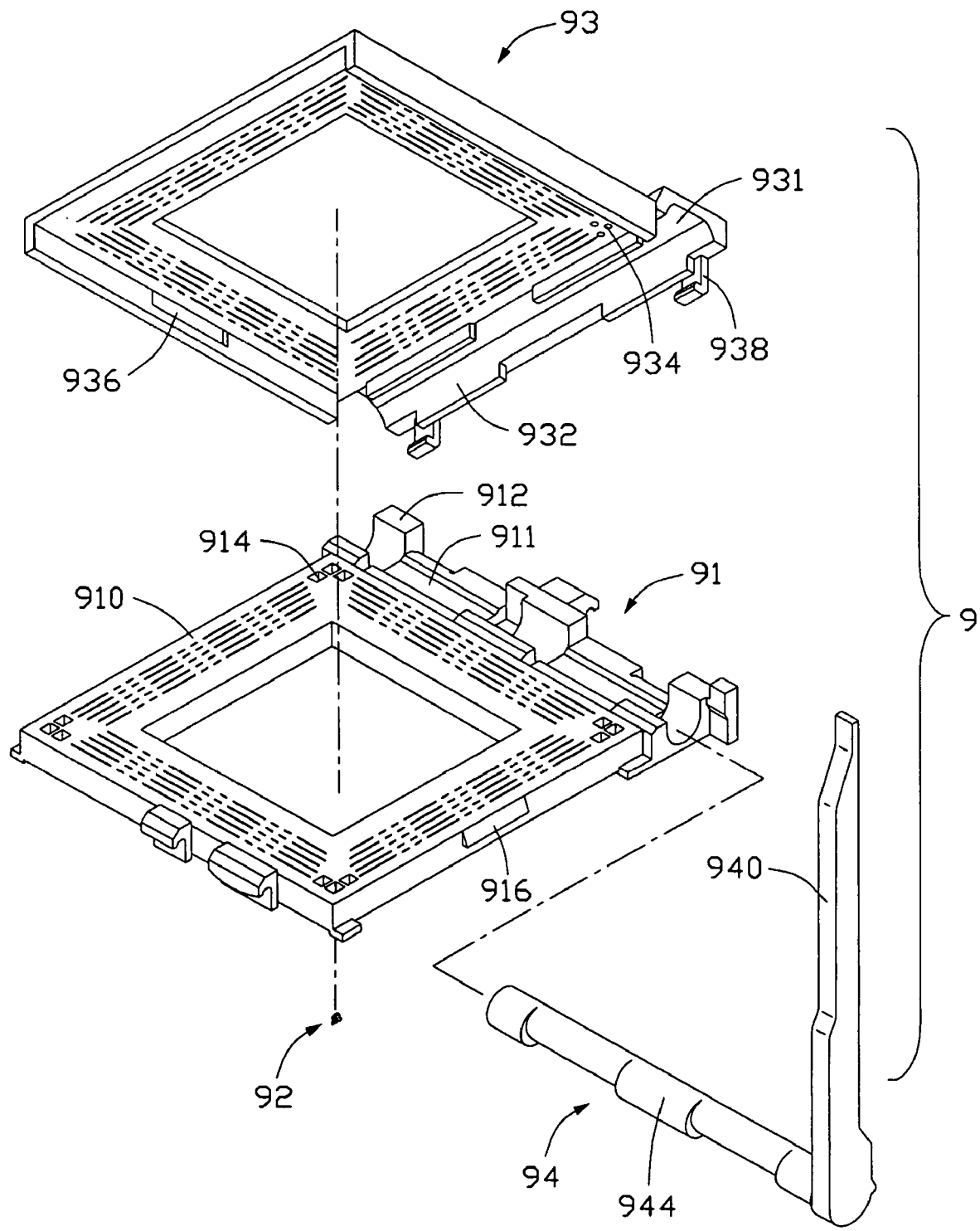
FIG. 1 is an exploded view of a conventional socket connector.
Figure 2:
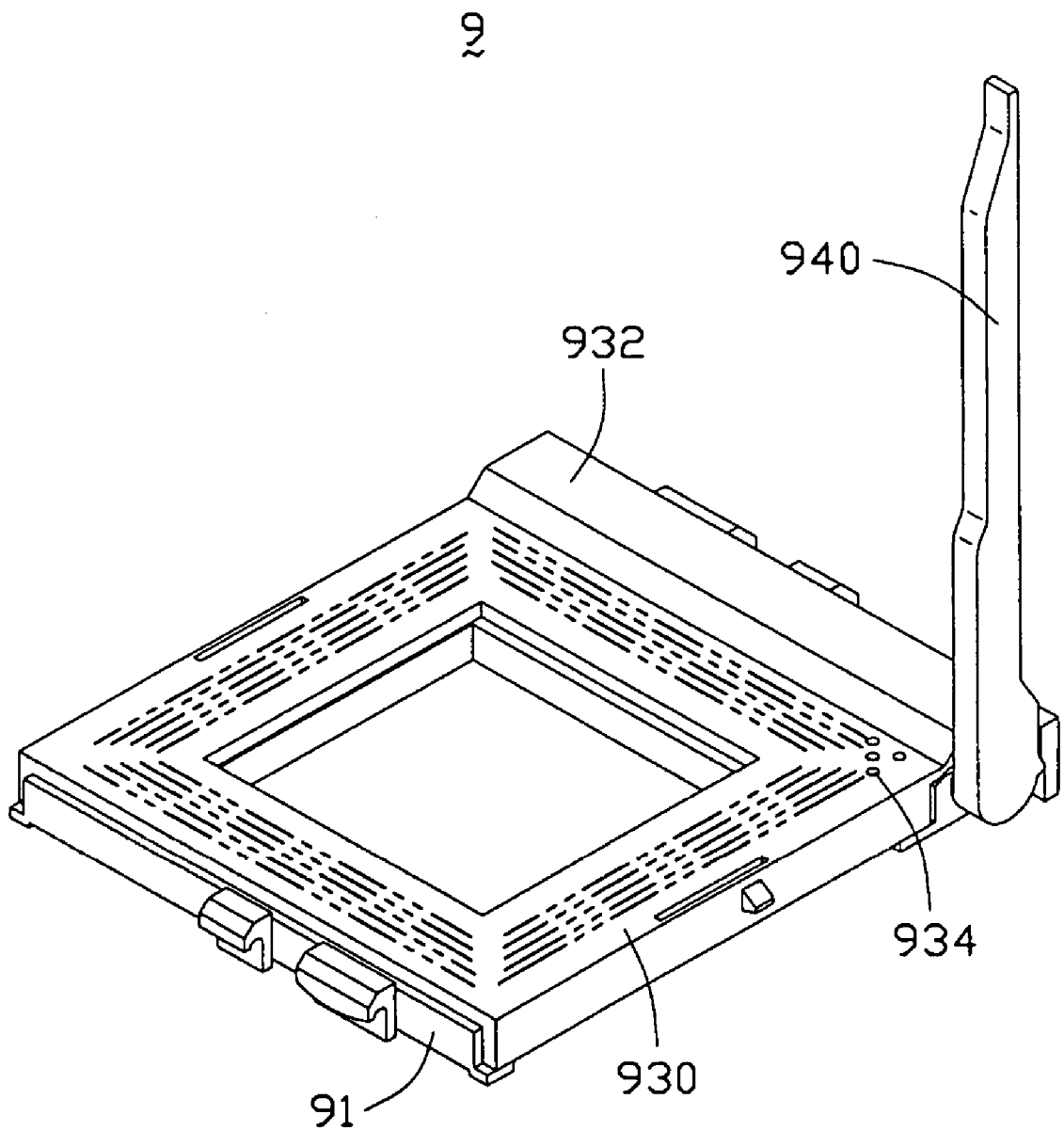
FIG. 2 is an assembled perspective view of the socket connector of FIG. 1.

Reference will now be made to the drawing figures to describe the present invention in detail.

Figure 3:
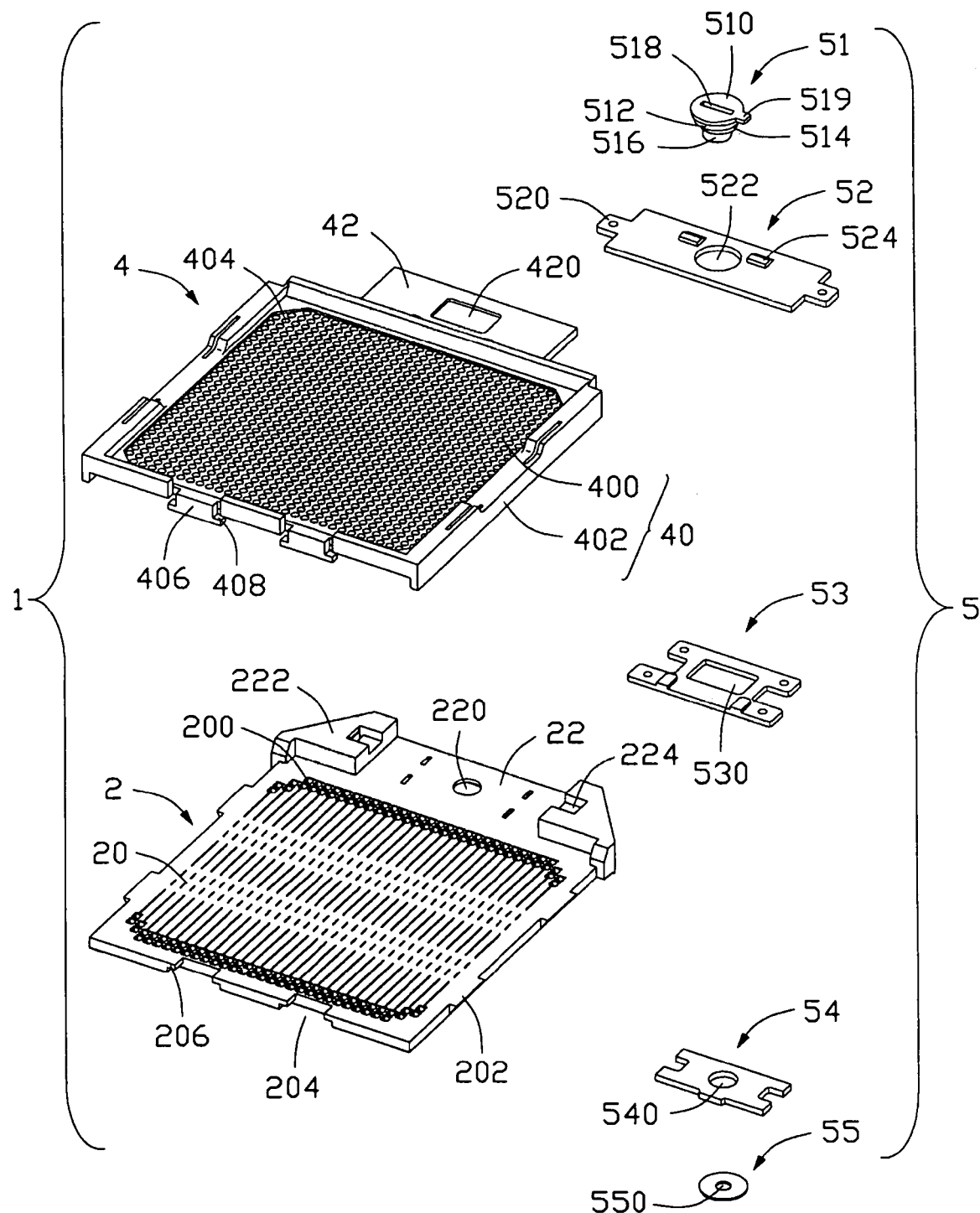
FIG. 3 is an exploded view from a top aspect of the socket connector in accordance with an embodiment of the present invention.
Figure 4:
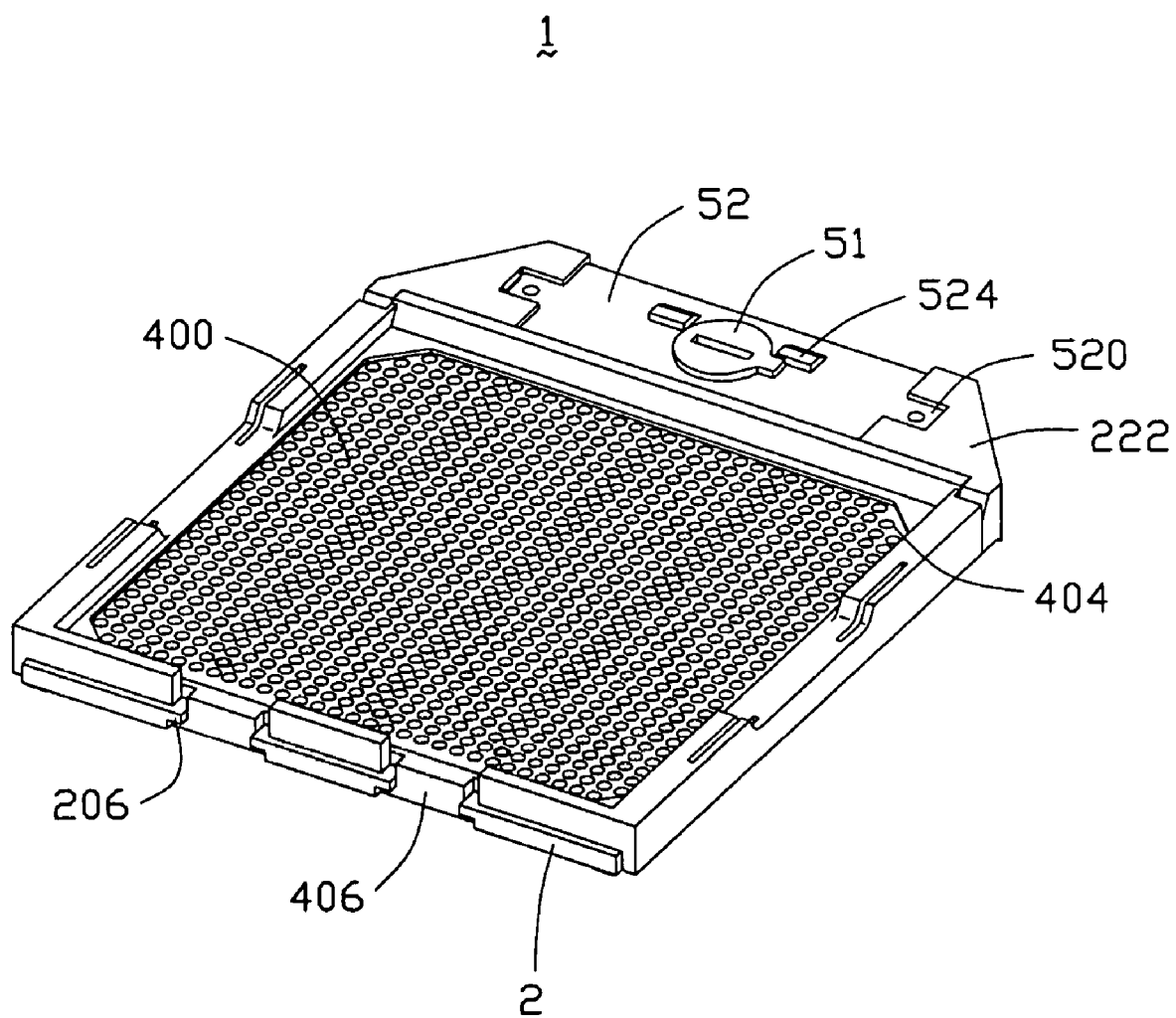
FIG. 4 is an assembled perspective view of the socket connector of FIG. 3.

Referring to FIGS. 3, a socket connector 1 in accordance with an embodiment of the present invention is used for connecting a chip module (not shown) to a printed circuit board (PCB, not shown) and comprises an insulative base 2, a cover 4 slidably engaged on the base 2 in a front-to-rear direction, a plurality of contacts (not shown) received in the base 2 and contacting with the PCB and an actuator 5.

The base 2 comprises an insulative main body 20 in the shape of a square, an insulative front portion 22 in front of the main body 20. The main body 20 defines a plurality of passageways 200 extending vertically through the main body 20. Each passageway 20 receives a contact (not shown) therein. A pair of protrusions 202 extend from each side edge of the main body 20, and a pair of T-shaped recesses 204 form on a rear edge of the main body 20, each having a pair of protrusions 206 extending face to face respectively. The front portion 22 comprises an upper surface (not labeled) for mating with the cover 4 and a bottom surface (not labeled) for mating with the printed circuit board. A base through hole 220 forms on the front portion 22 for engaging with the actuator 5. A pair of blocks 222 upwardly protrude from the upper surface of the front portion 22 and are respectively arranged on opposite lateral sides of the base through hole 220. A pair of recesses 224 are formed on opposite inner faces of blocks 222.

The cover 4 comprises an insulative body portion 40 in the shape of a square, an insulative header portion 42 in front of the body portion 40. The body portion 40 defines receiving portion 400 with a plurality of channels 404 provided in a one-to-one corresponding relationship with the passageways 200 of the underlying base 2, and comprises a pair of lateral flanges 402 depending down vertically on two sides thereof. Each flange 402 defines a pair of fixing slots in an inner wall thereof for receiving corresponding protrusions 202, respectively, each leaving a small distance for the protrusions 202 to slide therein along a lengthwise direction. A pair of T-shaped lock portions 406 form on a rear portion of the body portion 40 depending down vertically with a pair of protrusions 408 extending from two sides respectively. The header portion 42 defines a rectangular cover through hole 420.

The actuator 5 in present invention is in form of cam which comprising a cam 51, a metallic top cover plate 52, a metallic bottom cover plate 53, a base plate 54 and a washer 55.

The metallic top cover plate 52 comprises a first central hole 522 corresponding to the base through hole 220, a pair of ear portions 520 extending from two sides respectively, and a pair of stoppers 524 are formed on opposite sides of the first central hole 522 of the top cover plate 52 to stop the cam 51.

The metallic bottom cover plate 53 is in form of "I" type with an opening 530 is formed in a central portion. The bottom cover plate 53 is insert-molded on a bottom of the header portion 42 of the cover 4 for enhancing intension of it.

The base plate 54 is also in form of "I" type which smaller than the cover plate 53, an opening 540 is formed in a central portion of the plate 54 which has a diameter equal to the through hole 220 of the base 2. The base plate 54 is insert-molded on a bottom of front portion 22 for enhancing intension of it.

The cam 51 successively comprises a first, a second, a third, a fourth cylindrical posts 510, 512, 514, 516 and a fifth post (not shown) formed one on the other. The cylindrical posts progressively decrease in diameter from top to bottom. A diameter of the first post 510 is bigger than that of the central hole 522, and a slot 518 is formed on an up surface of the post 510 and a protrusion 519 extends from a circumferential periphery thereof. The second post 512, the third post 514, the fourth post 516 and the fifth post are respectively received in the central hole 522, the cover through hole 420, the second central hole 540 and an opening 550 on the washer 55. Central axes of the first, the second, the fourth cylindrical posts 510, 512, 516 and the fifth cylindrical post are in-line, but the third cylindrical post 514 is offset, which forms an eccentricity design.

In assembly, the cover 4 is assembled onto the base 2 with the protrusions 202 of the base 2 engaging with the fixing slots of the cover 4. The header portion 42 is pressed onto the front portion 22 between two blocks 222. The lock portions 406 is placed out of the recesses 204, and engaged on the recesses 204 by moving the cover 4 with protrusions 408 engaging with the protrusions 206 to make the rear portions of the base and the cover engaged together tightly. Each protrusion 202 is received into a fixing slot on the flange 402 to make the side portion of the base and the cover engaged together tightly. The top cover plate 52 is pressed on the cover 4 with ear portions 520 received in the recesses 224 respectively. Successively, the cam 51 is mounted into the socket connector 1 from the top via the central hole 522 and then through the through holes 420, 220 and openings 530, 540. The fifth post of the cam 51 extends through the hole 540 of the bottom plate 54 and the riveting end thereof is riveted with the washer 55 attached on a lower surface of the base 2, whereby the cam 51, the cover 4, the base 2, and the washer 55 are assembled together.

A tool can be fitted into the groove 518 of the cam 51 to rotate the cam 51 until the protrusion 519 abuts against the cam stopper 524 of the cover plate 52. Since the axis of the cam block 43 is offset from the axis of the post 510, the rotation of the cam 51 forces the cover 4 to slide along the base 2 in a front-to-rear direction, thereby making the pins (not shown) of the CPU passing through the channels 404 and extending into the passageways formed on the base 2 with zero insert force (ZIF). To making the pins of CPU engage with the terminals of the socket, the cam actuator 40 is rotated in an opposite direction from one of the two cam stoppers 524, to the other cam stopper 524, thereby the pins of the CPU is engaged with the terminals of the socket 1 and allowing the CPU to electrically connect with the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A socket connector for receiving a component having a plurality of contacts, comprising:
    a base arranged in a first plane defined by a lengthwise and a lateral direction and defining a plurality of passageways for receiving a plurality of terminals therein;
    a cover arranged in a second plane and slidably mounted on the base, the cover defining a plurality of channels provided in a one-to-one corresponding relationship with the passageways of the base for receiving the contacts;
    an actuator formed on a front portion of the base and the cover for driving the cover to slide on the base between a contact insert position and an engagement position in said lengthwise direction;
    a lock portion formed on a rear portion of one of the base and the cover opposite to the actuator and protruding along a horizontal direction out of a side edge of the corresponding one of the first and the second planes;
    a recess defined in a side edge of the other one of the base and the cover for receiving the lock portion to fasten two planes tightly;
    wherein the lock portion comprises a pair of substantially T-shaped portions formed on a rear portion of the cover extending towards the base with a pair of protrusions extending from two sides respectively; and
    wherein the recess is formed in T-shaped on a rear portion of the base for receiving the lock portion therein.

2. The socket connector as claimed in claim 1, wherein the base comprises a mainbody and a front portion in front of the mainbody, and the cover comprises a body portion and a header portion in front of the body portion.

3. The socket connector as claimed in claim 2, wherein the actuator comprises a cover plate made of metal, the cover plate defining a central hole for receiving a corresponding portion of the actuator.

4. The socket connector as claimed in claim 3, wherein the cover plate further comprises a top and a bottom cover plates respectively mounted onto a top and a bottom faces of the header portion.

5. The socket connector as claimed in claim 4, wherein the actuator comprises a base plate made of metal and received in a recess defined in the front portion.

6. The socket connector as claimed in claim 4, wherein the actuator is fanned of a cam and mounted through the header portion of the cover and the front portion of the base, the actuator having a protrusion outwardly protruding therefrom, the bottom cover plate having a pair of stoppers for stopping the protrusion thereby restricting a rotation of the actuator.

7. The socket connector as claimed in claim 1, wherein the lock portion is capable be moved into the receiving arrangement along the front-to-rear direction due to the movement of the cover.

* * * * *